(12) United States Patent
Francis et al.

(10) Patent No.: US 6,426,248 B2
(45) Date of Patent: Jul. 30, 2002

(54) PROCESS FOR FORMING POWER MOSFET DEVICE IN FLOAT ZONE, NON-EPITAXIAL SILICON

(75) Inventors: Richard Francis, Manhattan Beach; Chiu Ng, El Segundo, both of CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/734,429

(22) Filed: Dec. 11, 2000

Related U.S. Application Data
(60) Provisional application No. 60/182,689, filed on Feb. 15, 2000.

(51) Int. Cl.[7] .................... H01L 21/336; H01L 21/8234
(52) U.S. Cl. ........................................ 438/197; 438/270
(58) Field of Search ................................ 438/138, 197, 438/268, 270, 273, 305, 455, 585, 589, 269, 272, 301

(56) References Cited

U.S. PATENT DOCUMENTS

| | | | | |
|---|---|---|---|---|
| 4,771,013 A | * | 9/1988 | Curran | 438/313 |
| 4,925,812 A | * | 5/1990 | Gould | 438/652 |
| 5,355,022 A | * | 10/1994 | Sugahara et al. | 257/768 |
| 5,451,544 A | * | 9/1995 | Gould | 438/652 |
| 5,670,404 A | * | 9/1997 | Dai | 438/239 |
| 5,719,411 A | * | 2/1998 | Ajit | 257/132 |
| 6,100,140 A | * | 8/2000 | Okabe et al. | 438/270 |
| 6,194,290 B1 | * | 2/2001 | Kub et al. | 438/455 |

* cited by examiner

*Primary Examiner*—David Nelms
*Assistant Examiner*—Phuc T. Dang
(74) *Attorney, Agent, or Firm*—Ostrolenk, Faber, Gerb & Soffen, LLP

(57) ABSTRACT

A vertical conduction MOSFET semiconductor device is formed in a non-epitaxial (float zone) lightly doped silicon substrate. Device junction regions are formed in the top surface of the lightly doped float zone substrate. The backside of the wafer is then ground by surface grinding to attain a desired thickness. Phosphorus, or another N type dopant species, is then implanted into the back surface and is activated by a laser anneal. Back surface damage caused by grinding and/or implantation is intentionally retained. Alternatively, a "transparent" layer is formed by depositing highly doped amorphous silicon on the back surface. Titanium, or another metal (excluding aluminum), is then deposited on the back surface and annealed to form a titanium silicide, or other silicide for a contact electrode.

17 Claims, 1 Drawing Sheet

PROCESS FOR FORMING POWER MOSFET DEVICE IN FLOAT ZONE, NON-EPITAXIAL SILICON

RELATED APPLICATIONS

This application relates to copending application Ser. No. 09/566,219, filed May 5, 2000, entitled IGBT WITH AMORPHOUS SILICON TRANSPARENT COLLECTOR (IR-1462); application Ser. No. 09/565,148, filed May 5, 2000, entitled DIODE WITH WEAK ANODE (IR-1673); application Ser. No. 09/565,928, filed May 5, 2000, entitled ANNEAL-FREE PROCESS FOR FORMING WEAK COLLECTOR (IR-1706); application Ser. No. 09/565,973, filed May 5, 2000, entitled PROCESS FOR FORMING SPACED ACTIVATED WEAK COLLECTORS ON THIN IGBT SEMICONDUCTOR WAFERS (IR-1707); and application Serial No. 09/565,922, filed May 5, 2000, entitled HYDROGEN IMPLANT FOR BUFFER ZONE OF PUNCH-THROUGH NON EPI IGBT (IR-1708). This application also claims the filing date of Provisional Application Ser. No. 60/182,689, filed Feb. 15, 2000.

BACKGROUND OF THE INVENTION

The present invention relates to a process for the manufacture of a power MOSFET semiconductor device and, more specifically, relates to a novel process for the manufacture of such devices in a float zone (non-epi) monocrystalline silicon substrate.

Power MOSFETs are well known in the art and include such devices as shown in U.S. Pat. No. 5,008,725, the subject matter of which is incorporated herein by reference. Such devices are manufactured and sold by the International Rectifier Corporation of El Segundo, Calif. under the Registered Trademark "HEXFET".

Power MOSFETs are typically vertical conduction devices, namely devices in which the semiconductor substrate is part of the conduction path of the device. To reduce the on-resistance in the conduction path, a heavily doped semiconductor substrate of monocrystalline silicon is usually used. The junctions which form the channel and source regions, however, are not readily formed in such heavily doped material. Therefore, a thin lower concentration epitaxial layer is provided on the top surface of the substrate, and all junctions are formed in the epitaxial layer. The added epitaxial layer substantially increases the cost of the starting wafer material and thus the cost of the device.

It is known that semiconductor devices such as IGBTs and diodes can be made in float zone (non-epi) material as disclosed in the above mentioned related applications and as described, for example, in the paper entitled "NPT-IGBT-Optimizing for Manufacturability" by Burns et al., 0-7803-3106-0/9655.00 1996 IEEE, pages 331 to 334. In that paper, a typical D-MOS type structure is formed in the top surface of an N⁻ float zone wafer and a boron implant is applied to the back side of the wafer. This is followed by an aluminum collector contact, used in place of a laser activation anneal of the boron implanted P region to avoid a high temperature anneal step which would adversely affect the DMOS structure on the top surface. Note that if aluminum only is added to the back surface, without the boron implant, that the aluminum will produce a P type region, again producing an IGBT type device.

If a MOSFET is to be made in N⁻ float zone material, it is necessary to form an N⁺ back contact region without inadvertently forming a P type region and without a high temperature activation anneal of an N type implant which would adversely affect the top wafer structure.

It is therefore desirable to provide a manufacturing process in which the junctions are formed in a lightly doped semiconductor substrate that is without an epitaxial layer but which does not have significantly increased on-resistance.

SUMMARY OF THE INVENTION

In accordance with the present invention, a lightly doped, N⁻ float zone wafer is provided as the semiconductor substrate. Junction regions such as a typical D-MOS structure that form a vertical conduction MOSFET are formed in the top surface of the monocrystalline wafer substrate using high temperature processes known in the art. Then, to reduce the on-resistance, the back surface of the wafer is ground to reduce the thickness of the substrate. A protective layer may be deposited on the top surface prior to grinding. Subsequently, the back surface of the wafer receives a shallow (500 Å) ion implant dose of phosphorus or other N type dopant species, to provide a good ohmic drain contact region.

The implanted dopant is then only partially activated by a low temperature anneal to prevent affecting the D-MOS junction in the top surface. When using a laser anneal, most of the laser energy is absorbed in the thin N⁺ implant and it melts and regrows with maximum activation. Alternatively, a "transparent" cathode region can be formed on the back surface using very highly doped N type amorphous silicon layer in place of the ion implant. A backside contact electrode is then formed preferably with titanium silicide and titanium or other metals. Aluminum is not used to avoid the creation of a P type region.

Advantageously, the vertical conduction device is formed without an epitaxial silicon layer so that the cost of the starting material is significantly reduced. The junctions, however, are formed in a lightly doped silicon substrate and the top surface of the wafer is processed using known processing steps. Moreover, the grinding of the back surface of the wafer reduces the conduction path through the substrate, which reduces the resistance of the device. The grind also creates a polycrystalline silicon structure in the back of the wafer which is helpful for later forming the metal silicide layer. Further, the partially activated dopant species that is implanted into the back surface or the "transparent" cathode provides a good ohmic contact with the back contact electrode.

Other features and advantages of the present invention will become apparent from the following description of the invention which refers to the accompanying drawings.

DETAILED DESCRIPTION OF THE INVENTION

Figure 1:
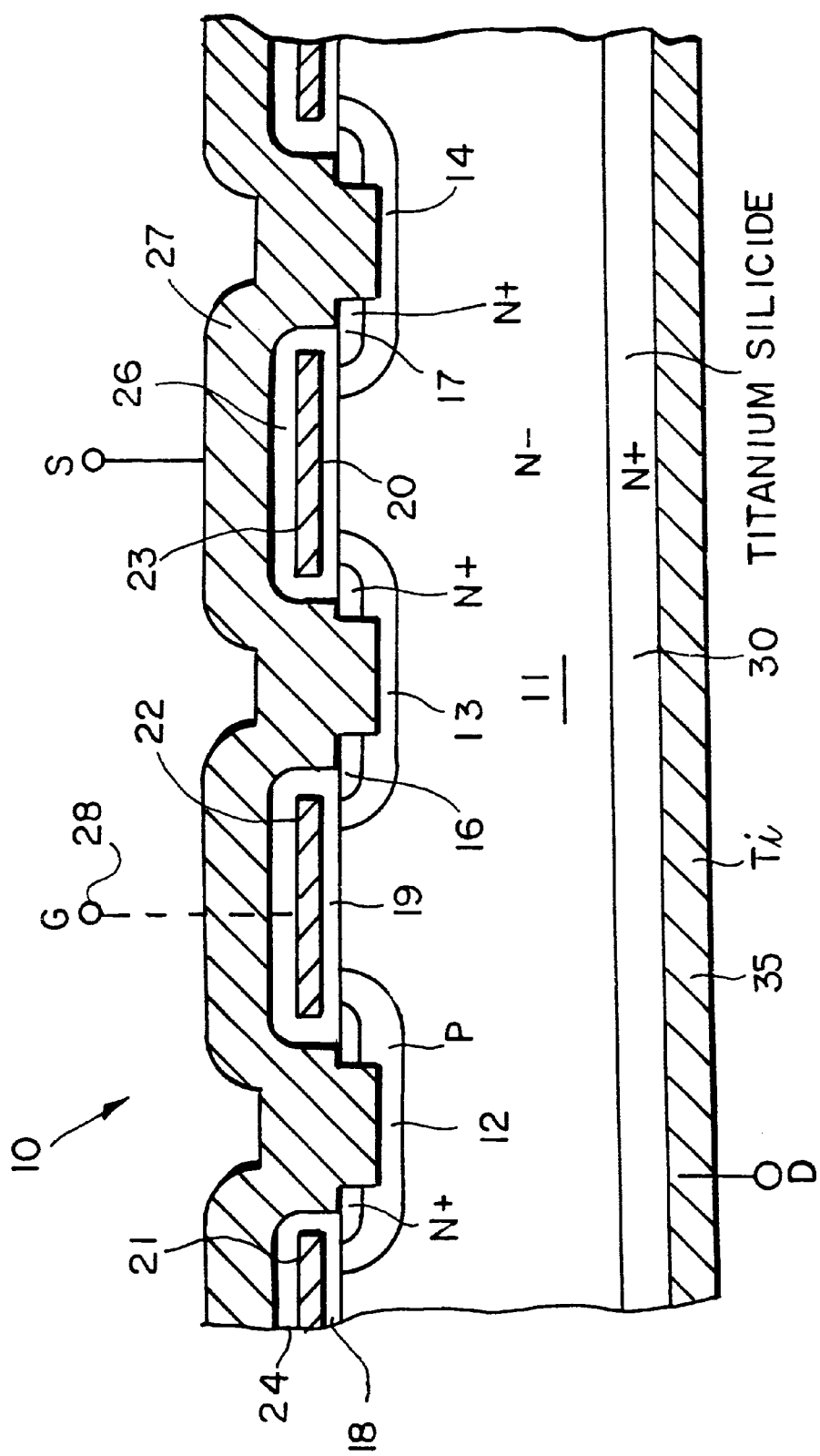
FIG. 1 is a cross-section of a few cells of the active area of a vertical conduction power MOSFET made in accordance with the invention

Referring to FIG. 1, there is shown a small portion of the active area of a vertical conduction power MOSFET 10 which is made in accordance with the invention. The device is formed in a non-epi N⁻ float zone wafer 11 as contrasted to the usual wafer having an epitaxially deposited layer which receives most of the device junction patterns. The term wafer is used interchangeably with chip or die, in which a wafer usually is a large area slice of silicon in which a large number of individual identical die or chips are simultaneously formed and are later singulated.

The first step in the process is the formation of a junction pattern in the top surface of the wafer 11, using conventional manufacturing techniques such as those used in the manufacture of any standard vertical conduction MOSFET. FIG. 1 shows this pattern as a D-MOS type pattern, in which a plurality of spaced P type base or channel diffusions 12, 13 and 14 receive respective N⁺ source regions 15, 16 and 17 to define respective lateral invertible channel regions which underlie gate oxide sections 18, 19 and 20 and conductive polysilicon gate sections 21, 22 and 23 respectively. Gate sections 21, 22 and 23 are insulated by a suitable insulation such as low temperature deposited oxide layers 24, 25 and 26 from a common aluminum source electrode 27 which is electrically connected to the P bases 12, 13 and 14 and their respective source regions. A gate terminal 28 is connected to each of the gate segments 21, 22 and 23 which are otherwise interconnected.

Any desired topology can be used for the top junction pattern. Thus, the base regions 12, 13 and 14 may be polygonal cells and the gate oxide and conductive gate sections portions of a common lattice. Alternatively, the bases 12, 13 and 14 may be parallel spaced stripes, and the gates are similarly stripe elements.

After the completion of the D-MOS (or other) junction pattern, using plural high temperature steps and plural masking steps, the thick, relatively rugged wafer is thinned down to at least 50% of its original thickness, as by grinding from about 500 microns to about 200 microns (for a 1200 volt device) and the back drain contact must be formed. In one embodiment of the invention, a shallow N type implant, for example, phosphorus at 1E15 to 1E6 atoms/cm² is applied to the back surface, to a depth of about 500 Å. It is not possible to activate this implant by a high temperature anneal since the D-MOS structure on the top of the wafer, because the functions in the D-MOS structure would move, and further, because passivating materials and the like would be damaged by the high temperature anneal. Therefore, the implant is preferably activated by a laser anneal in which the laser energy is selectively absorbed in the 500 Å N type layer to melt and regrow the layer with a high degree of activation. The at least partially activated phosphorus then forms the N⁺ contact region 30 in FIG. 1 to which ohmic contact can be made.

Alternatively, a "transparent" conductive layer is formed on the wafer back surface after grinding by sputtering or evaporating a heavily N doped amorphous silicon film on the back surface. Typically, the amorphous silicon is phosphorus doped with about 0.1 to 1.0 atomic percent phosphorous.

Then, a backside contact layer 35 is formed by depositing a layer of titanium on the back surface and then sintering the wafer to form titanium silicide. Though titanium is preferably used, other refractory metals, such as nickel or silver may also be used. However, aluminum is avoided to avoid the production of a P type layer.

The invention also takes advantage of an otherwise undesired byproduct of the backside grinding. Typically, the backside grinding produces a layer of polycrystalline silicon in the back surface of the device as a result of damage induced by the grinding. Further, the backside implant also causes damage to the back surface. Ordinarily, the polysilicon layer is an undesired byproduct. However, in the present invention, the polycrystalline silicon byproduct layer may be advantageously used to form the titanium silicide metal contact layer that provides an ohmic contact with the substrate. Preferably, the backside implant dopant is only partially activated to preserve at least part of the polycrystalline silicon layer that is formed during the backside grinding and ion implant steps so that the polycrystalline silicon is present for silicide formation.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A process for the manufacture of a power MOSFET device, said process comprising the steps of:

(a) preparing a wafer of float zone monocrystalline silicon of a given conductivity type without an epitaxially formed function receiving layer;

(b) forming a MOSFET junction pattern in the top surface of said wafer;

(c) grinding the back surface of said wafer to reduce the thickness of said wafer by greater than 50% and leaving said back surface in an intentionally roughened state and with a polycrystal structure;

(d) producing an increased concentration of said given conductivity type in said back surface at a temperature which is too low to cause significant movement of said MOSFET junction pattern or other damage thereto; and (e) applying an ohmic contact layer to said back surface, wherein the material of said ohmic contact layer does not act as a donor or acceptor impurity atom in said wafer.

2. The process of claim 1, wherein said junction pattern is a DMOS pattern.

3. The process of claim 1, wherein said wafer thickness is reduced to less than about 200 microns.

4. The process of claim 1, wherein said increased concentration in said back surface is produced by a metal silicide infusion into said roughened back surface.

5. The process of claim 4, wherein said metal silicide is a titanium silicide.

6. The process of claim 1, wherein said increased concentration in said back surface is produced by a shallow implant less than about 500 Å deep of an atom which will produce an increased concentration of said given conductivity type, followed by a laser activation of said implant.

7. The process of claim 6, wherein said given conductivity type is N and said atom is phosphorous.

8. The process of claim 1, wherein said increased concentration in said back surface is produced by the deposition of a thin layer of amorphous silicon which is doped by an impurity atom of the given conductivity type.

9. The process of claim 8, wherein said given conductivity type is N and said atom is phosphorous.

10. The process of claim 6, wherein said junction pattern is a DMOS pattern.

11. The process of claim 8, wherein said junction pattern is a DMOS pattern.

12. The process of claim 10, wherein said wafer thickness is reduced to less than about 200 microns.

13. The process of claim 11, wherein said wafer thickness is reduced to less than about 200 microns.

14. The process of claim 12, wherein said increased concentration in said back surface is produced by a metal silicide infusion into said roughened back surface.

15. The process of claim 13, wherein said increased concentration in said back surface is produced by a metal silicide infusion into said roughened back surface.

16. The device of claim 14, wherein said ohmic contact layer on said back surface is titanium.

17. The device of claim 15, wherein said ohmic contact layer on said back surface is titanium.

* * * * *